US007872473B2

(12) United States Patent
Kitching et al.

(10) Patent No.: US 7,872,473 B2
(45) Date of Patent: Jan. 18, 2011

(54) COMPACT ATOMIC MAGNETOMETER AND GYROSCOPE BASED ON A DIVERGING LASER BEAM

(75) Inventors: John Kitching, Boulder, CO (US); Elizabeth A. Donley, Boulder, CO (US); Eleanor Hodby, Boulder, CO (US); Andrei Shkel, Irvine, CA (US); Erik Jesper Eklund, Costa Mesa, CA (US)

(73) Assignee: The United States of America as represented by the Secretary of Commerce, the National Institute of Standards and Technology, Washington, DC (US)

( * ) Notice: Subject to any disclaimer, the term of this patent is extended or adjusted under 35 U.S.C. 154(b) by 50 days.

(21) Appl. No.: 12/186,690

(22) Filed: Aug. 6, 2008

(65) Prior Publication Data
US 2009/0039881 A1 Feb. 12, 2009

Related U.S. Application Data

(60) Provisional application No. 60/954,555, filed on Aug. 7, 2007.

(51) Int. Cl.
*G01V 3/00* (2006.01)
(52) U.S. Cl. .................. 324/305; 324/300; 324/301; 324/304; 324/319
(58) Field of Classification Search ......... 324/300–322; 372/70, 29.01, 29.014, 50.21
See application file for complete search history.

(56) References Cited

U.S. PATENT DOCUMENTS

| | | | | |
|---|---|---|---|---|
| 3,495,161 A * | 2/1970 | Bell | | 324/304 |
| 3,675,067 A * | 7/1972 | Brun | | 313/564 |
| 7,038,450 B2 | 5/2006 | Romalis et al. | | 324/304 |
| 7,145,333 B2 | 12/2006 | Romalis et al. | | 324/304 |
| 7,239,135 B2 | 7/2007 | Abbink et al. | | 324/304 |
| 7,282,910 B1 * | 10/2007 | Kanegsberg | | 324/304 |
| 7,292,031 B2 * | 11/2007 | Abbink et al. | | 324/304 |
| 7,292,111 B2 | 11/2007 | Abbink et al. | | 331/94.1 |
| 7,323,941 B1 * | 1/2008 | Happer et al. | | 331/3 |
| 7,359,059 B2 | 4/2008 | Lust et al. | | 356/459 |
| 7,379,486 B2 * | 5/2008 | Lust et al. | | 372/70 |
| 7,652,473 B2 * | 1/2010 | Kawabata | | 324/304 |
| 7,719,268 B2 * | 5/2010 | Hersman et al. | | 324/304 |
| 7,723,985 B2 * | 5/2010 | Smith | | 324/301 |
| 7,737,689 B2 * | 6/2010 | Masuda | | 324/305 |

OTHER PUBLICATIONS

I.K. Kominis, T.W. Kornack, J.C. Allred, M.V. Romalis; A Subfemtotesla Multichannel Atomic Magnetometer; Nature Publishing Group, vol. 422, Apr. 10, 2003.
J.C. Allred, R.N. Lyman, T.W> Kornack, M.V. Romalis; High-Sensitivity Atomic Magnetometer Unaffected by Spin-Exchange Relaxation; The American Physical Society, vol. 89, No. 13, Sep. 23, 2002.

* cited by examiner

*Primary Examiner*—Melissa J Koval
*Assistant Examiner*—Dixomara Vargas
(74) *Attorney, Agent, or Firm*—Kermit Lopez; Luis Ortiz; Ortiz & Lopez, PLLC

(57) ABSTRACT

An atomic magnetometer that simultaneously achieves high sensitivity, simple fabrication and small size. This design is based on a diverging (or converging) beam of light that passes through an alkali atom vapor cell and that contains a distribution of beam propagation vectors. The existence of more than one propagation direction permits longitudinal optical pumping of atomic system and simultaneous detection of the transverse atomic polarization. The design could be implemented with a micro machined alkali vapor cell and light from a single semiconductor laser. A small modification to the cell contents and excitation geometry allows for use as a gyroscope.

41 Claims, 10 Drawing Sheets

COMPACT ATOMIC MAGNETOMETER AND GYROSCOPE BASED ON A DIVERGING LASER BEAM

CROSS-REFERENCE TO PROVISIONAL PATENT APPLICATION

This patent application claims priority to U.S. Provisional Patent Application Ser. No. 60/954,555, entitled "Compact Atomic Magnetometer and Gyroscope Based on a Diverging Laser Beam," which was filed on Aug. 7, 2007, the disclosure of which is incorporated herein by reference in its entirety.

TECHNICAL FIELD

Embodiments are generally related to magnetometers and gyroscope methods and systems. Embodiments are also related to the field of sensing magnetic fields.

BACKGROUND OF THE INVENTION

Magnetometers are used for sensing magnetic fields. Applications include geophysical surveying, nuclear magnetic resonance (magnetic resonance imaging), magneto-cardiography, magneto-encephalography and perimeter surveillance. Gyroscopes sense rotation. These instruments are used in inertial navigation and platform stabilization (anti-roll systems in cars, for example). The implementations described here allow for high sensitivity and simultaneously inexpensive fabrication, small size and low power consumption. These implementations would be suitable for remote deployment that requires extended operation under battery power and integration into handheld, portable systems.

Considerable prior art has been focused on gyroscopes based on polarization of the alkali and noble gas atoms through optical pumping and spin-exchange collisions, which was initially developed in the 1960s and refined considerably throughout the 1970s and 1980s. The work was largely abandoned in the early 1980s with the invention of the ring laser gyroscope and fiber-optic gyroscope, which promised equivalent sensitivity with reduced complexity. Recently, there has been a resurgence of interest in the nuclear magnetic resonance (NMR) gyroscope due to the miniaturization possibilities allowed by micro machined alkali atom vapor cells.

There are various types of commercial magnetometers, each with its own application area. These are summarized in Table 1 below (Table 1 is only provided for exemplary purposes and is not meant to limit the scope for the invention):

TABLE 1

Comparison of commercial magnetometers.

| Type | Sensitivity (nT) | Size (cm$^3$) | Power (mW) | Cost ($) | Comments |
|---|---|---|---|---|---|
| SQUID | 10$^{-5}$ | 10$^{5(*)}$ | ~1000 | 10$^4$ | Cryogenic |
| Coil | 0.0001 | 100 | 10 | 100 | AC only |
| Cesium | 0.001 | 100 | 20,000 | 10$^4$ | Scalar |
| Flux gate | 0.01 | 100 | 50 | 100 | Magnetic |
| Magneto-resistive | 1 | 0.001 | 0.01 | 10 | High bw |
| Hall | 100 | 1 | 100 | 10 | Very reliable |
| Expected performance metrics of the diverging beam magnetometer: | | | | | |
| CSAM | 10$^{-5}$ | 1 | 50 | 100 | Scalar |

(*)Including cryostat

For many years, magnetometers based on superconducting quantum interference devices (SQUIDS) had unsurpassed sensitivities in the range of 1-10 fT/√Hz. These instruments require cryogenic cooling and therefore are large, expensive and difficult to operate. Recently, atomic magnetometers similar to the invention described in this disclosure but larger and without the diverging beam geometry, were shown to achieve a sensitivity of below 1 fT/√Hz. Commercial atomic magnetometers based on Cs are approximately a few 100 cm$^3$ in volume, run on 20 W of electrical power and achieve sensitivities in the range of 1 pT/√Hz. The cost of Cs magnetometers is higher than all but SQUID-based sensors. Proton magnetometers, another type of atomic magnetic sensor, are less expensive than Cs magnetometers and are also more accurate, but suffer from considerably worse sensitivity, ~1 nT/√Hz.

Search coil magnetic sensors can achieve sub-pT sensitivities at high frequencies (>1 MHz) but are largely insensitive to DC magnetic fields. Search coils have been used for many years as the sensors in magnetic resonance imaging (MRI) instruments. Flux gate magnetometers typically achieve sensitivities in the range of 1-10 pT/√Hz and are fairly small (a few cm$^3$) but require considerable power (~1 W). They are also magnetic, which makes them difficult to use in arrays. Commercial magneto-resistive sensors are sensitive to ~1 nT/√Hz but are very small (4 mm$^3$, packaged), and very inexpensive. Finally, Hall probe magnetometers have very poor sensitivity (100 nT/√Hz) but are inexpensive.

An important distinction between atomic magnetometers and most other sensor types is that atomic magnetometers are scalar sensors, which means they sense the magnitude of the magnetic field, rather than the projection along one spatial direction. This is particularly important for applications on moving platforms since platform motion adds considerable noise to a vector sensor as the angle between the field and the sensor axis changes.

One very high performance commercial gyroscope is the hemispherical resonator gyroscope (HRG), which achieves an exceptional angle-random walk (ARW) and bias drift but is very expensive to manufacture. Ring laser gyros (RLGs) and fiber-optics gyros (FOGs) also achieve navigation-grade performance at somewhat reduced cost. MEMS gyroscopes generally have very poor bias stability.

It is therefore believed that a solution to such drawbacks lies in the development of a magnetic field sensing apparatus, such as a gyroscope, and method as presented in this application.

BRIEF SUMMARY

The following summary of the invention is provided to facilitate an understanding of some of the innovative features unique to the present invention and is not intended to be a full description. A full appreciation of the various aspects of the invention can be gained by taking the entire specification, claims, drawings and abstract as a whole.

It is therefore one aspect of the present invention to provide for improved magnetometer methods and systems.

It is another aspect of the present invention to provide for improved gyroscope methods and systems.

The above and other aspects of the invention can be achieved as will now be briefly described. The innovation the present invention brings to the development of gyroscopes and magnetometers is associated with the diverging beam geometry. This geometry allows a simple, highly compact implementation of the NMR gyroscope that could be fabricated at a much lower cost than gyroscopes of equivalent sensitivity. Additional advantages are the use of differential detection that will reduce the low-frequency noise and improve the angle-random walk, as compared with detection methods that do not allow for differential detection.

In accordance with features of the present invention, a magnetic field sensing device is disclosed that includes a cell adapted for containing alkali atoms at a their vapor pressure so that the alkali atoms can become polarized, a light source producing a spatially diverging or converging light field, a wave plate to circularly polarize light from the light source, at least one photodetector adapted to measure magnetic field strength based on a reaction of the light with the alkali atoms. A flex circuit adapted to provide signals from the at least one photodetector to a computer (adapted as external signal conditioning and detection circuitry facilities) can also be included. A heater can also be included, wherein the heater is used to heat the cell and a thermal sensor is used to stabilize the temperature at a predetermined value. The apparatus can be adapted in a gyroscope implementation that comprises a magnetic shield and an additional gas. Any noble gas with a non-zero nuclear spin can be used, including $^{129}$Xe.

In accordance with a method of using the present invention, light emitted from a light source passes through a set of optics adapted to circularly polarize light from the light source, attenuate the light and change its spatial mode. The resulting light field has a spatially converging or diverging profile. The light passes through a cell. An oscillating magnetic field is generated at a Larmor frequency of the alkali atoms in a direction along the average light propagation direction with a component perpendicular to said magnetic field with at least one of a plurality of coil. To adapt the magnetometer for use as an NMR gyroscope, an oscillating magnetic field at the Larmor frequency of the noble gas atoms is also applied to the cell. An atomic polarization is caused to precess at a drive frequency about a magnetic field. A transverse component of the atomic polarization is detected by monitoring the absorption of the edges of a diverging light beam using at least one photodetector. Then the magnitude of the precessing transverse atomic polarization is determined by subtracting signals coming from opposite sides of the light beam.

BRIEF DESCRIPTION OF THE DRAWINGS

The accompanying figures, in which like reference numerals refer to identical or functionally-similar elements throughout the separate views and which are incorporated in and form part of the specification, further illustrate embodiments of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
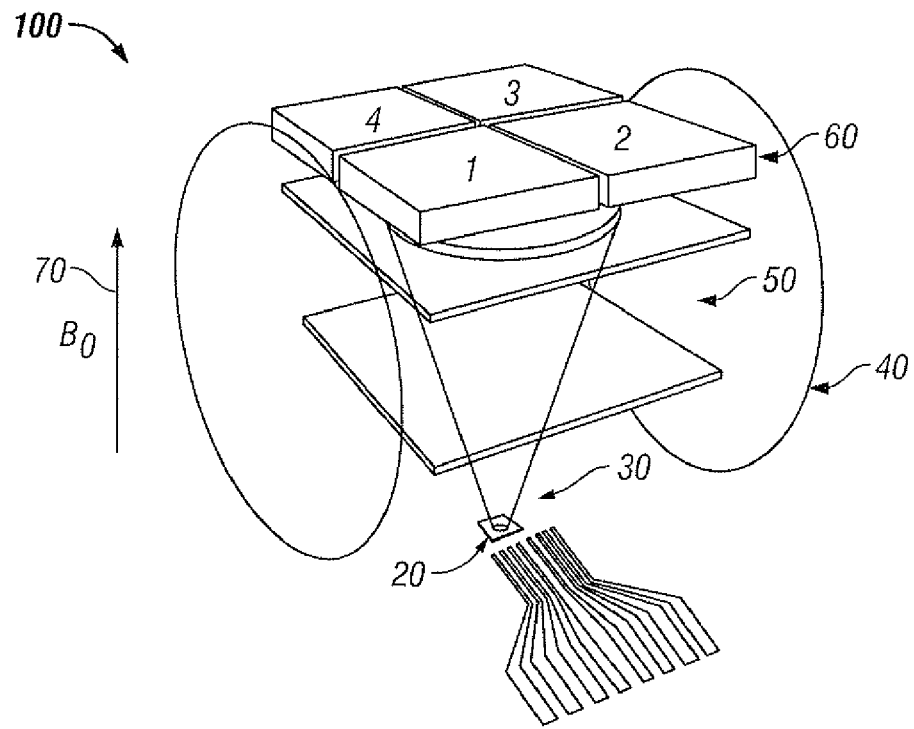
FIG. 1 illustrates a schematic of an apparatus in which one embodiment of the present invention can be implemented.

FIG. 1 illustrates a schematic of an apparatus in which one embodiment of the present invention can be implemented. Shown in the figure is an atomic magnetometer, which could also be operated as a gyroscope under suitable conditions 10. Light is emitted from a semiconductor laser 20, such as a vertical-cavity surface emitting laser (VCSEL). It passes through some optics 30 that makes the laser polarization circular, and that may also attenuate the light beam and change its spatial mode. The light then enters an alkali vapor cell 50 with some divergence. The vapor cell contains alkali atoms at their vapor pressure, along with a buffer gas such as $N_2$ or Ne, which prevents frequent collisions of the alkali atoms with the cell walls. In the gyroscope implementation, there may be an additional noble gas, such as $^{129}$Xe, whose nuclei can be polarized via spin-exchange with the alkali atoms. We assume here that the magnetic field, $B_0$, 70 is oriented along the direction of the average propagation direction of the light field. Alkali atoms in the cell are thereby polarized along this direction by the circularly polarized light field. The transmitted light power is detected by photodetectors 60.

A set of radio-frequency (RF) coils 40, positioned about the cell creates an oscillating magnetic field in the cell. When the frequency of this field is tuned to the Larmor frequency, $\omega_L$, of the atoms in the magnetic field, the atomic spins precess coherently about the magnetic field direction. The Larmor frequency of the atoms is related to the magnetic field by $\omega_L = \gamma B_0$, where $\gamma$ is the gyromagnetic ratio of the atoms ($2\gamma \times 3.5$ Hz/nT in the case of $^{133}$Cs and $2\gamma \times 11.8$ mHz/nT in the case of $^{129}$Xe). The precessing noble gas spins (if present) create a transverse magnetic field, which affects the alkali spins in a manner that depends on the orientation of the noble gas spin. The precessing alkali spins create a transverse polarization in the atomic vapor, which causes a change in the absorption of the light field that depends on the propagation direction of the light. Because of the circularly symmetric nature of the diverging light beam, the transverse polarization generates a differential absorption. For example, if the atomic polarization has a component along the x direction, light that has a component in the x direction will see reduced absorption, while light that has a component in the −x direction will see increased absorption. As the atomic polarization vector precesses, therefore the spatial profile of the diverging light field will be modified accordingly.

Figure 2:
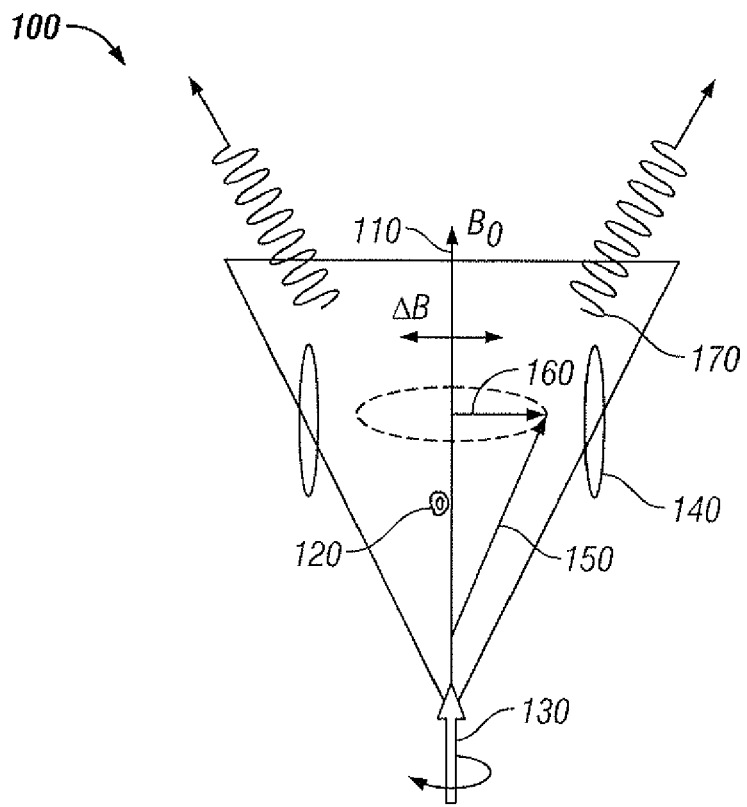
FIG. 2 illustrates a schematic of the operation of a diverging beam magnetometer in accordance with one embodiment of the present invention.

FIG. 2 illustrates a schematic of the operation of a diverging beam magnetometer 100 in accordance with one embodiment of the present invention. The instrument is placed in the vicinity of the DC magnetic field to be sensed, $B_0$, 110. Atoms, 120 are polarized along the average direction of propagation of the incident light field, 130. RF coils, 140, generate an oscillating magnetic field at the Larmor frequency of atoms in a direction perpendicular to the magnetic field. This causes the atomic polarization to precess at the drive frequency about the magnetic field $B_o$, as shown by the precessing vector, 150. The transverse component of the atomic polarization, 160, is detected by monitoring the absorption of the edges of the diverging light beam, 170. By subtracting the signals coming from opposite sides of the light beam, the magnitude of the precessing transverse atomic polarization can be determined.

Figure 3:
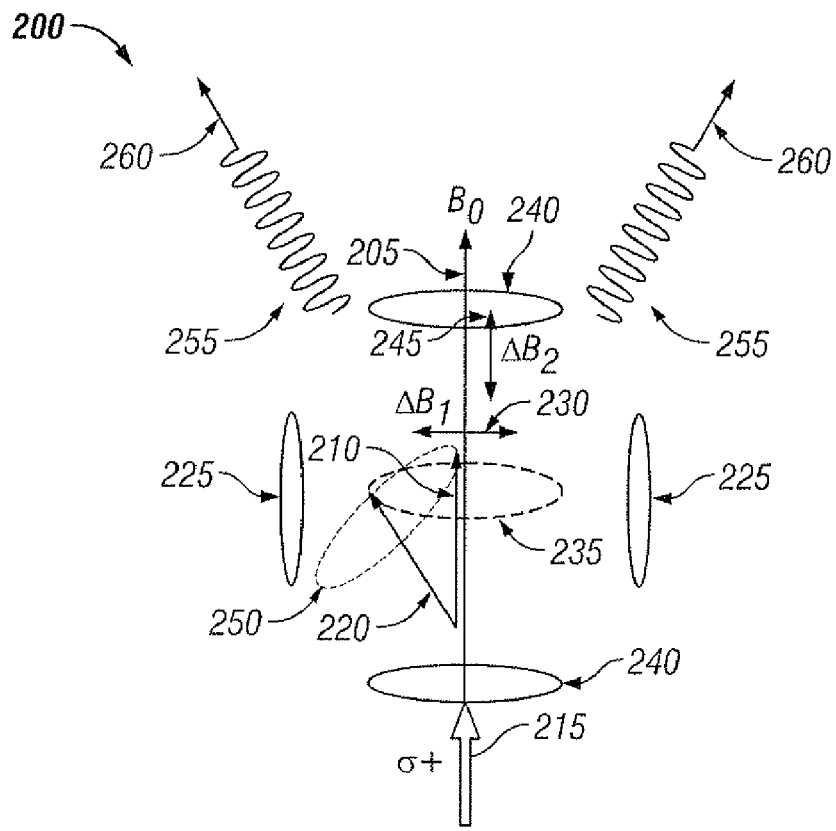
FIG. 3 illustrates a schematic of the operation of a diverging beam gyroscope in accordance with one embodiment of the present invention.

FIG. 3 illustrates a schematic of the operation of a diverging beam gyroscope 200 in accordance with one embodiment of the present invention. The instrument is placed in a well-controlled, known, uniform magnetic field, $B_0$, 205. The spin of alkali atoms (such as $^{133}$Cs, $^{87}$Rb, or $^{39}$K), 210 is polarized via optical pumping with a component along the average direction of propagation of the incident light field, 215. The spin of the nuclei of noble gas atoms, 220 ($^{129}$Xe, $^3$He or equivalent) is polarized with a component along the average direction of propagation of the incident light field via spin exchange collisions with the alkali atoms. One set of RF coils, 225, generate an oscillating magnetic field, □$B_1$, 230, in a direction perpendicular to the magnetic field, $B_o$, 205 at the Larmor frequency of noble gas atoms 220. This causes the nuclear polarization to precess at the drive frequency of the RF coils 225 about the magnetic field $B_0$ 205. A second AC magnetic field □$B_2$ 245 is applied parallel to the static field $B_o$ 205, at the Larmor frequency of the alkali atoms 210. This field causes the alkali atom spins to precess, 250, about the total field created by the static field, $B_o$ 205, and the precessing polarization of the noble gas nuclei, 220. The transverse component of the atomic polarization is detected by monitoring the absorption of the edges of the diverging light beam, 255. By subtracting the signals, 260, coming from opposite sides of the light beam, the magnitude of the precessing transverse atomic polarization, and in turn the Larmor frequency of both the alkali and the noble gas species. The angular rate of the vessel, can be determined from the induced shift in the measured noble gas Larmor frequency.

Figure 4:
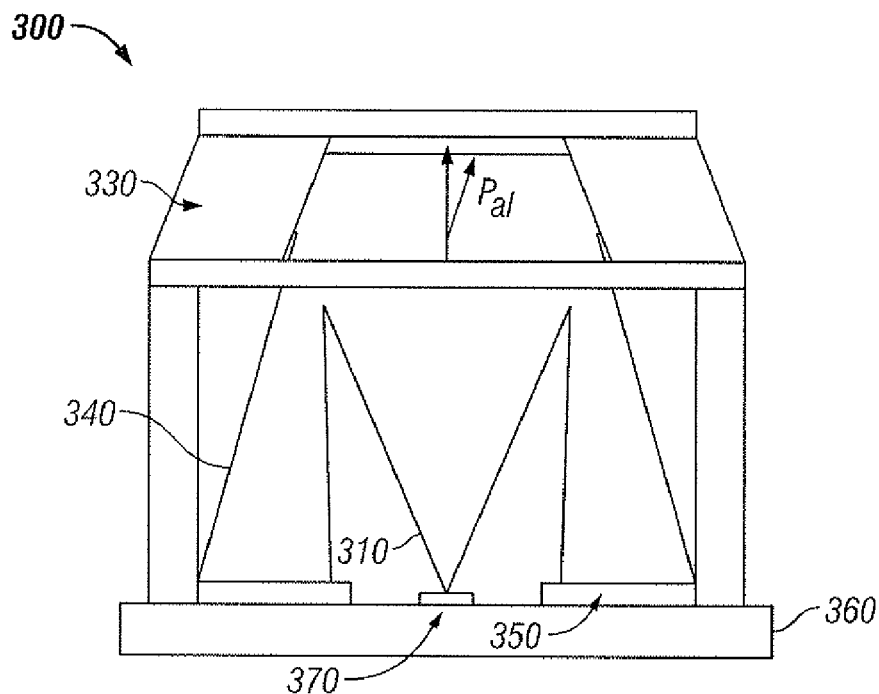
FIG. 4 illustrates a schematic of an implementation of the diverging beam magnetometer or gyroscope as a micro-electro-mechanical systems ("MEMS") device in accordance with one embodiment of the present invention.

FIG. 4 illustrates a schematic of an implementation of the diverging beam magnetometer or gyroscope 300 in accordance with one embodiment of the present invention. In this implementation, the diverging components of the laser beam 310 are reflected by angled walls inside the alkali vapor cell 330 to form counter-propagation probe beams 340. These beams are reflected a second time off the opposite wall and the power is detected by photodiodes 350 placed on the base plate 360 with the laser 370.

Figure 5:
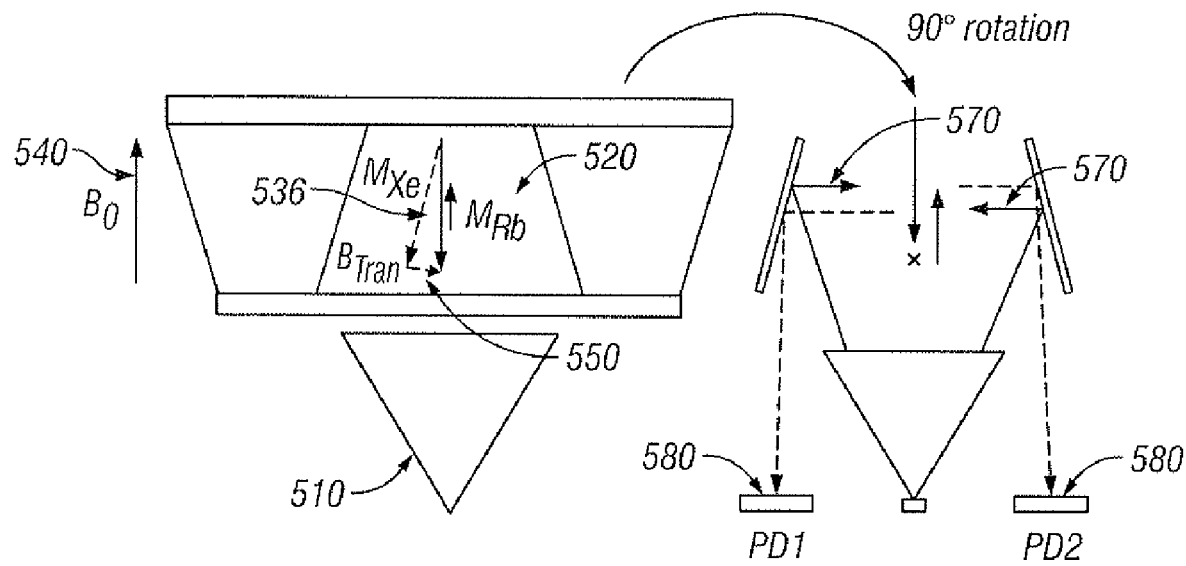
FIG. 5 illustrates a schematic of the basic operation of a co-magnetometer nuclear magnetic resonance ("NMR") gyroscope as a comagnetometer.

FIG. 5 illustrates a schematic of the basic operation of a co-magnetometer nuclear magnetic resonance ("NMR") gyroscope as a co-magnetometer. The diverging light beam 410 polarized the alkali species 420 in the nominal direction of the light propagation. The noble gas species 430 is subsequently polarized via spin-exchange collisions with the alkali atoms. A longitudinal magnetic field $B_0$ 440 is applied with a magnitude that largely cancels the field due to the noble gas as seen by the alkali atoms. Under rotation, the noble gas spins 430 become misaligned with the longitudinal field 440 and the spin orientation rotates slightly about the component of the longitudinal field 440 perpendicular to the noble gas spin orientation. The rotation of the noble gas spin 430 causes a small transverse field $B_{tran}$ 450 seen by the alkali atoms 420. This transverse component 550 causes the orientation of the alkali species, 460, to change slightly. The orientation change of the alkali species causes a differential absorption of the counter-propagating light fields 470. The difference in absorption is measured by two photodetectors 480. The difference in the signals measured by the photodetectors 480 is proportional to the instrument rotation rate.

Figure 6:
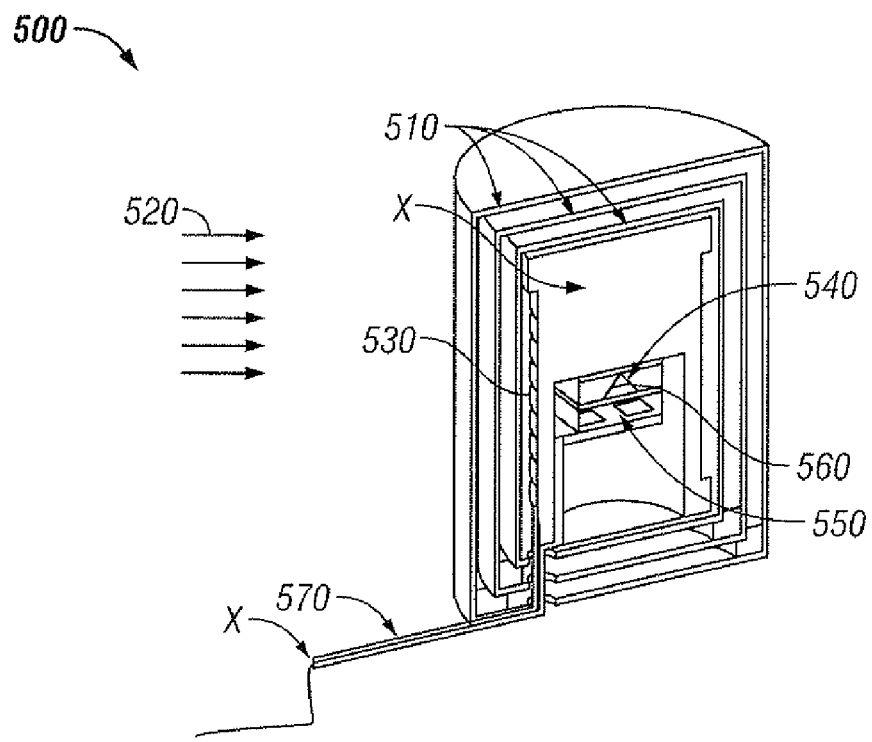
FIG. 6 illustrates a schematic of a compact nuclear magnetic gyroscope ("NMRG") in accordance with one embodiment of the present invention.

FIG. 6 illustrates a schematic of a cross-sectional view of a compact nuclear magnetic gyroscope 500 ("NMRG") in accordance with one embodiment of the present invention. A multilayer magnetic shield 510 (here 3 layers) is used to suppress the external magnetic field 520 (e.g., Earth's field, fields created by adjacent electrical components, and other environmental fields) by over six orders of magnitude. Inside the shields, a set of 3-axis coils 530 are used to create a very precise static magnetic field $B_o$. Additionally, the coils 530 are also used to compensate for residual magnetic fields (external or internal to the shields) that may exist in the area of the NMR cell 540. The light from the laser on the base-plate is circularly polarized by a wave plate and transmitted through the NMR cell 540. The light is then reflected off the angled cell walls back onto photodiodes on the base plate 550. Two small flex circuits 570 provide paths for electrical signals for both the base plate 550 and the 3-axis coils 530 to flow between the interior of the shield 510 and the exterior.

Figure 7A:
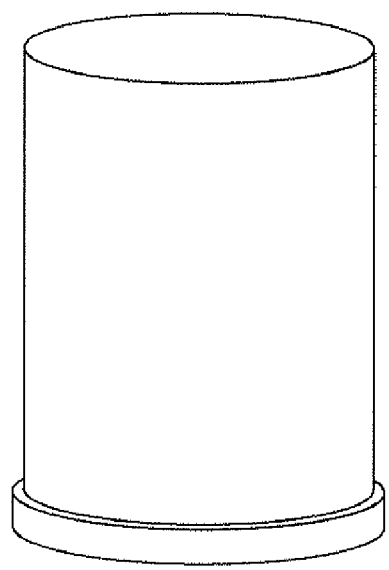
FIG. 7(a) and FIG. 7(b) illustrate a schematic of the exterior and cross-sectional view of magnetic shields in accordance with one embodiment of the present invention.
Figure 7B:
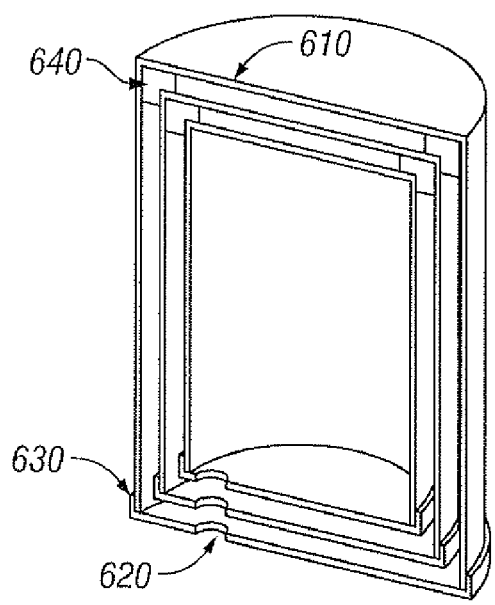

FIG. 7(a) and FIG. 7(b) illustrate a schematic of the exterior 600 and cross-sectional view of magnetic shields 610 in accordance with one embodiment of the present invention. While a 3-layer shield is shown for illustrative purposes, the number of layers will vary depending on the desired shielding factor and the particular application. The shields may be machined and welded from a high-permeability material such as mumetal. The nuclear magnetic resonance gyroscope is to be positioned at the center of the shields and the flex circuits from the coils and the base plate is to be threaded through the holes 620 of the shield caps 630. The spacers 640 that are used to separate the shield layers are machined from a nonmagnetic material.

Figure 8A:
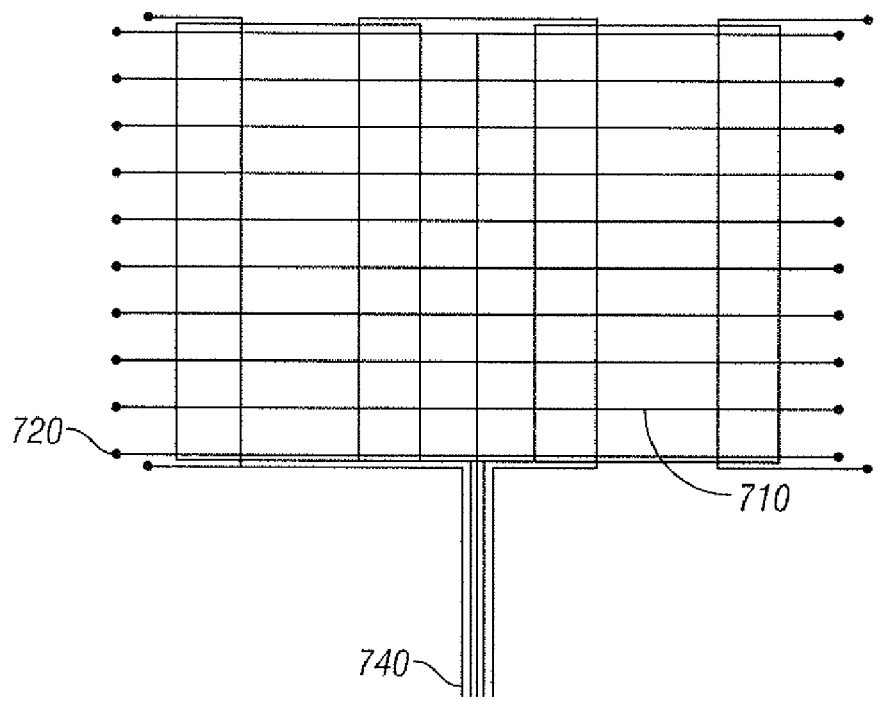
FIG. 8(a) and FIG. 8(b) illustrate a schematic of a two-layer flex circuit fabricated on a planar substrate and a flex circuit wrapped around a cylindrical holder to form a set of three-axis coils in accordance with one embodiment of the present invention.
Figure 8B:
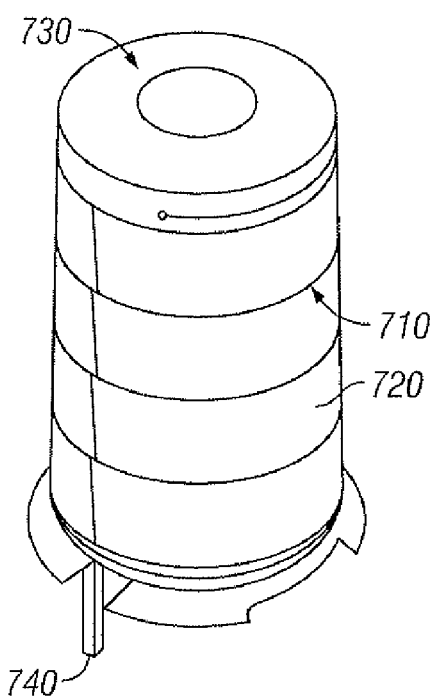

FIG. 8(a) and FIG. 8(b) illustrate a schematic of a two-layer flex circuit fabricated on a planar substrate and a flex circuit wrapped around a cylindrical holder to form a set of three-axis coils 700 in accordance with one embodiment of the present invention. A set of three-axis coils 700 are used to generate the static and oscillating magnetic fields ($B_0$ 205 □$B_1$ 230 and □$B_2$ 245 in FIG. 3) as well as for compensation of residual fields. The coils 710 are fabricated as highly conductive traces (e.g. metal) on a two-layer flexible planar substrate 720, such as polyimide. The planar substrate is then wrapped around a machined cylindrical holder 730 and the conductive pads on two opposite sides of the substrate are brought in contact and affixed to each other (e.g. soldered) to form a set of three-axis coils 700. The tail end of the flex of the coils 740 contains bonding pads, which allows the coils 700 to be connected to external circuitry once the flex has been threaded through the shields. Once assembled, both the length and the diameter of the coil structure are on the order of 2 to 10 millimeters. The coil for the longitudinal magnetic field may be designed as a solenoid The coils for the transverse magnetic fields may be designed as sets of Helmholtz coils.

Figure 9A:
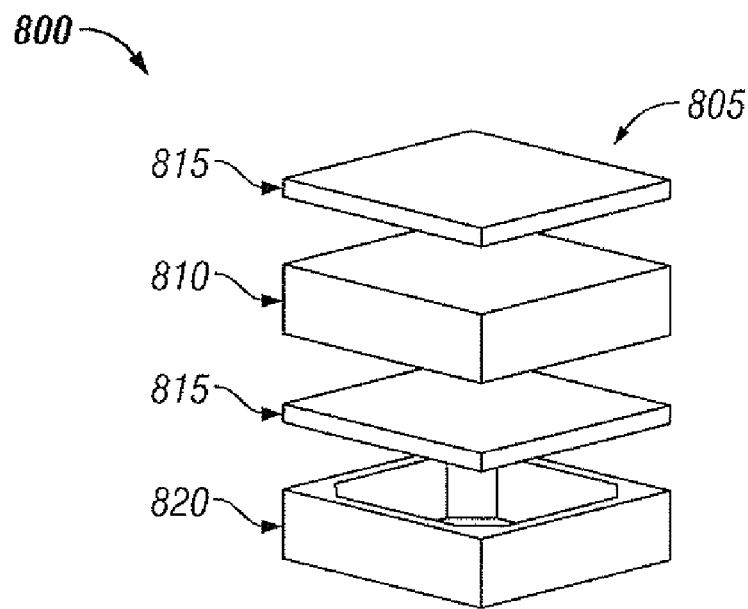
FIG. 9(a), FIG. 9(b), FIG. 9(c), and FIG. 9(d) illustrate a schematic of the main NMRG components, including a NMR cell etched in silicon and bonded between two layers of Pyrex, base plate containing VCSEL and photodiodes with microflex circuit for interconnects, assembled NMRG, and cross-sectional view of assembled NMRG in accordance with one embodiment of the present invention.
Figure 9B:
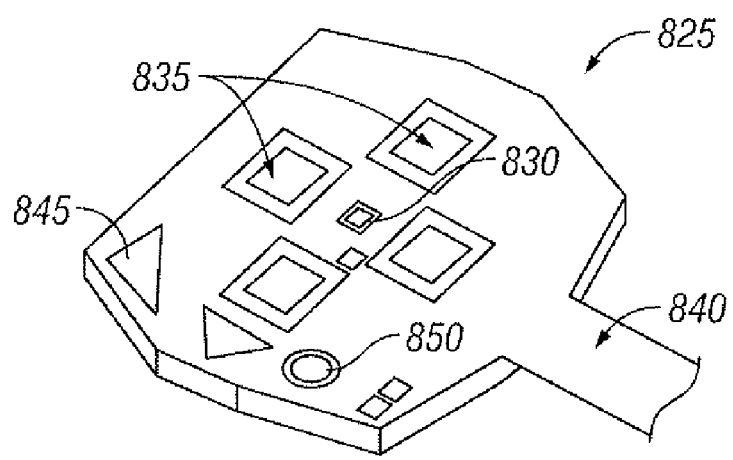
Figure 9C:
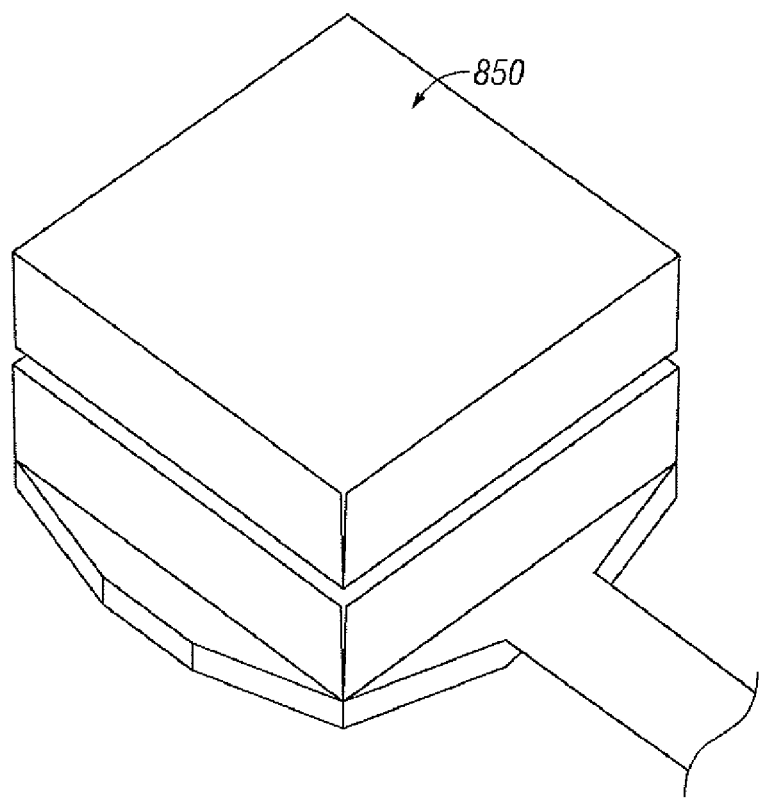
Figure 9D:
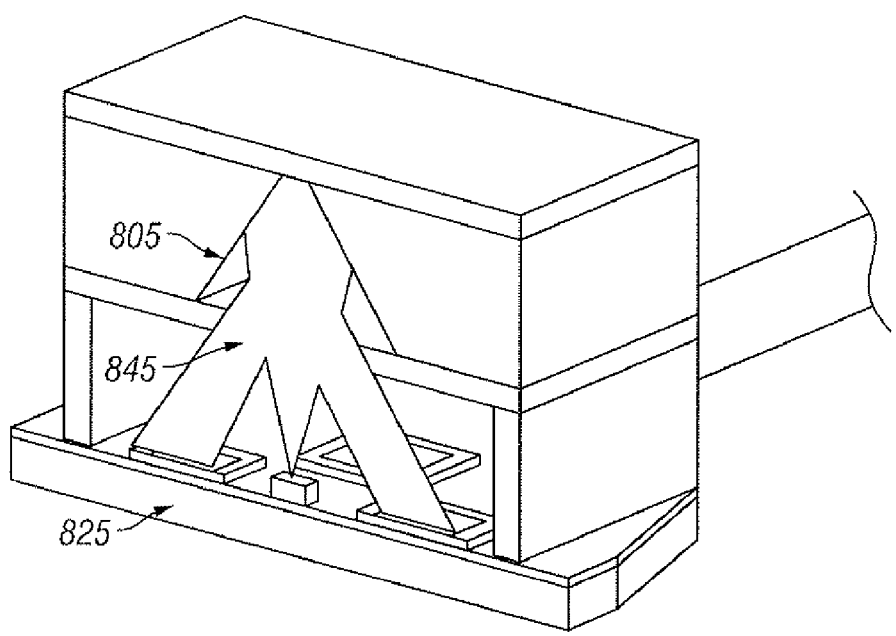

FIG. 9(a), FIG. 9(b), FIG. 9(c), and FIG. 9(d) illustrate a schematic of the main NMRG 800 components, including 9(a) NMR cell 805 etched in silicon 810 and bonded between two layers of Pyrex 815, FIG. 9(b) base-plate (825) containing VCSEL 830 and photodiodes 835 with microflex circuit 840 for interconnects, FIG. 9(c) assembled NMRG 850, and 9(d) cross-sectional view of assembled NMRG 850 in accordance with one embodiment of the present invention.

The vapor cell is similar to the cells previously used in chip-scale atomic clocks. FIG. 9(a) shows the cell components before assembly. A thick (~1 mm) silicon wafer 810 is first anisotropically through-etched, using for example KOH. Once the silicon is etched, highly reflective mirrors may optionally be deposited on the cell walls to increase the strength of the signal received by the photodiodes. Next, a thin layer of Pyrex glass 815 is anodically bonded to the etched silicon 810. The cell 805 is then filled with an alkali metal as well as noble gases. Finally, a second layer of Pyrex 815 is used to seal the cell using anodic bonding. The spacer 820 in FIG. 9(a) is either etched or machined and is used to provide a significant space between the electrical components on the base-plate and the cell in order to minimize residual magnetic fields in the cell and optimize the distance from the cell to the laser for the diverging beam geometry. The spacer 820 is also used to simplify the relative alignment between the optical components on the base-plate (FIG. 9(b)) and the cell 805. Both the side length and the height of the assembly in FIG. 9(a) are on the order of a few millimeters.

Figure 12:
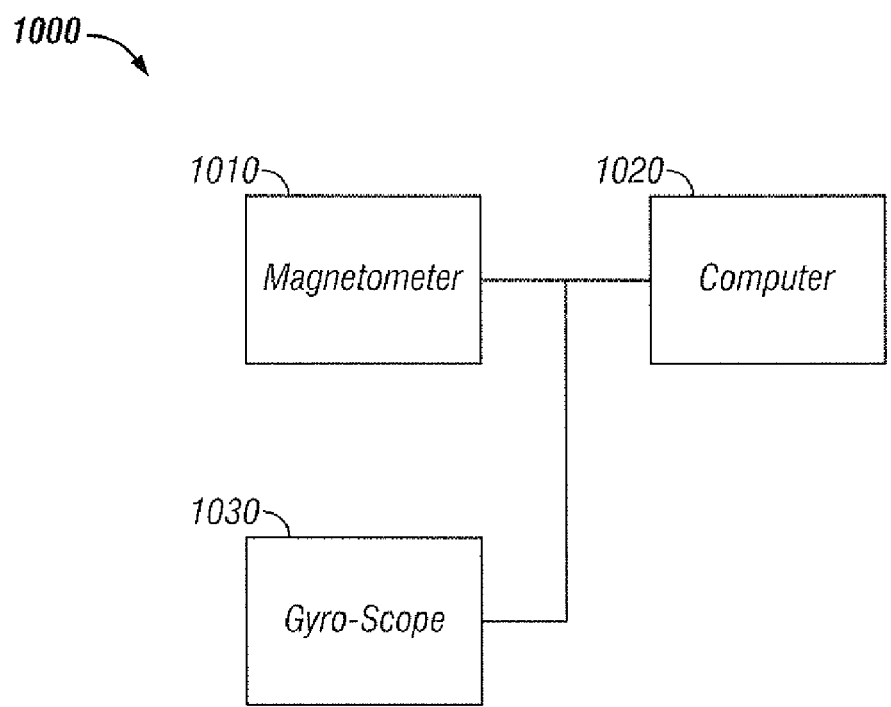
FIG. 12 illustrates a system architecture wherein a magnetometer is connected to a computer.

FIG. 9(b) shows the base-plate 825 on which all of the electrical components are attached. The light source is a vertical-cavity surface-emitting laser (VCSEL) 830, located in the center of the base plate. The cathode of the VCSEL 830 is located on the backside of the chip and is attached to the base plate using, for example, solder bump bonding. The anode of the VCSEL 830 is located on the front side of the chip and is connected to the base-plate with a small wire-bond (not shown). Four flip-chip bonded, back-illuminated photodiodes 835 are used to detect the reflected light intensity. All of the pads of these photodiodes 835 are facing the base-plate 825 and may be solder bump bonded to achieve electrical contacts. Alternatively, the photodiodes (and potentially also the VCSEL 830) may be integrated directly in the base-plate 825 material, which would eliminate the need for die attachment and solder bumping. The flex circuit 840 may be fabricated using a photo definable polyimide. This flex is needed in order to provide interconnects from the base-plate 825, through the hole in the magnetic shield, and to the external signal conditioning and detection circuitry which can be provided via a computer as shown in FIG. 12

A few other components need to be integrated with the parts shown in FIG. 9(b). First, a quarter-wave plate needs to be placed on top of the VCSEL 830 to convert the linearly polarized light emitted by the VCSEL 830 to circularly polarized light. The wave plate can be placed directly on top of the VCSEL 830 using a small holder or alternatively in between the spacer and the NMR cell. In addition, a heater 855 is also needed in order to heat the cell to a temperature at which a sufficient rubidium vapor pressure is achieved (about 100° C.). The heater 855 can be implemented as traces on the base-plate 825, or alternatively a separate heater chip may be used. Furthermore, a thermal sensor 860 is needed in order to stabilize the temperature at a predetermined value. Similarly to the heater, this sensor may be integrated on the base-plate 825 or designed as a separate chip placed in close proximity to the parts in FIG. 9(b).

FIG. 9(c) depicts how the cell and spacer is aligned and attached to the base-plate. A cross-sectional view of this is displayed in FIG. 9(d), where a portion of the light 845 path is also illustrated. Note that the central part of the light 845 beam, used for optical pumping, will travel straight through the cell 805 and exit through the small opening on the top.

Figure 10A:
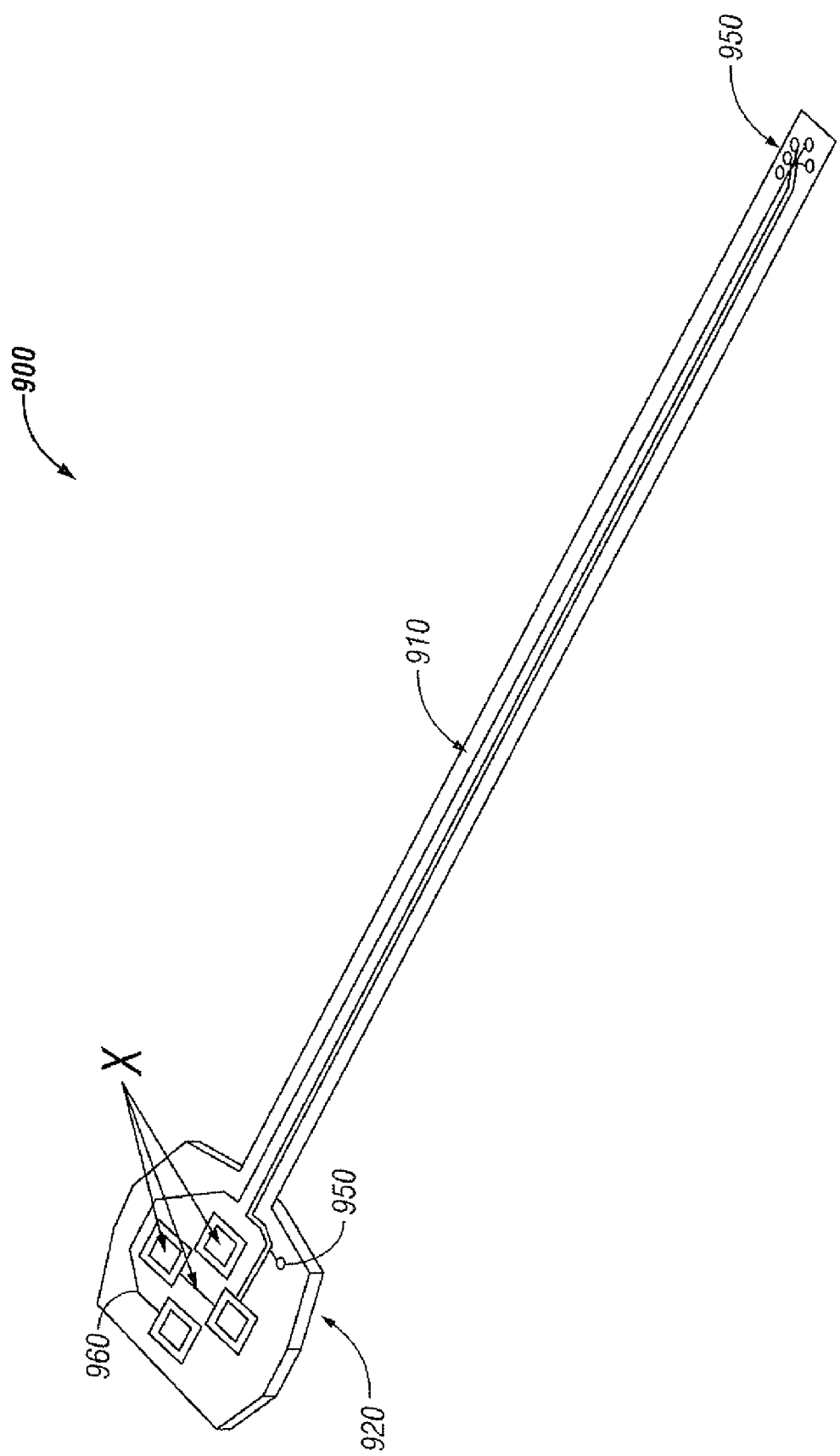
FIG. 10(a) and FIG. 10(b) illustrate a schematic of a base plate with flex circuit after the electrical components have been attached and a cross-sectional view of the fabrication process for the base plate with flex circuit in accordance with one embodiment of the present invention.
Figure 10B:
Figure 10B:
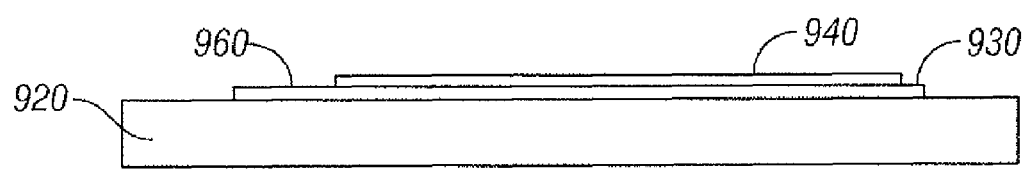
Figure 10B:
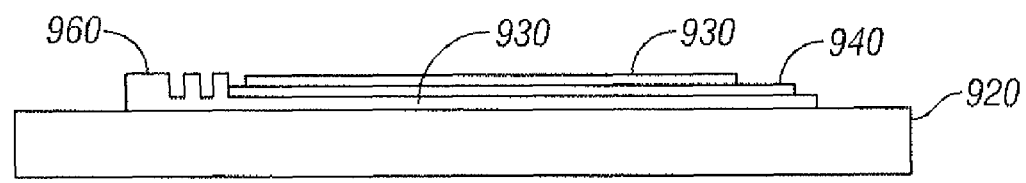
Figure 10B:
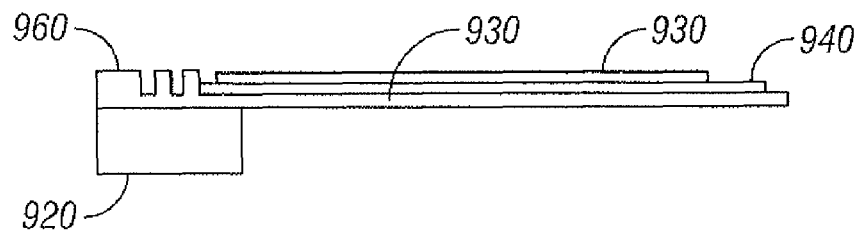

FIG. 10(a) and FIG. 10(b) illustrate a schematic of a base plate 960 with flex circuit 910 after the electrical components have been attached and a cross-sectional view of the fabrication process for the base plate 960 with flex circuit 910 in accordance with one embodiment of the present invention. FIG. 10(a) depicts an expanded view of the base-plate 960 that was illustrated in FIG. 9(b), showing the full length of the flex circuit 910. As shown in FIG. 10(b), this part is fabricated on top of a silicon wafer 920 by first patterning a highly flexible material 930, such as photo definable polyimide. Next, in step 2, traces of a highly conductive material 940 (e.g., aluminum, copper, or gold) are defined on top of the polyamide 930 (using, for example, a liftoff process). In the same processing step, bonding pads 950 are defined on both the base-plate 960 (for die attachment and wire-bonding) as well as on the tail end of the flex which can be adapted to connect components on the base-plate to external circuitry (e.g., a computer). Optionally, electroplating may also be employed to increase the thickness of the conductors. In Step 3, a second layer of polyimide 930 is patterned on top of the conductors (with openings for all of the bonding pads on the base-plate and on the tail end of the flex). In the fourth and final processing step, the silicon wafer 920 is etched everywhere except for underneath the base-plate 960, using, for example, deep-reactive ion etching. After this step a flex circuit 910 with highly flexible insulated conductors that can be threaded through the magnetic shields is obtained.

Figure 11:
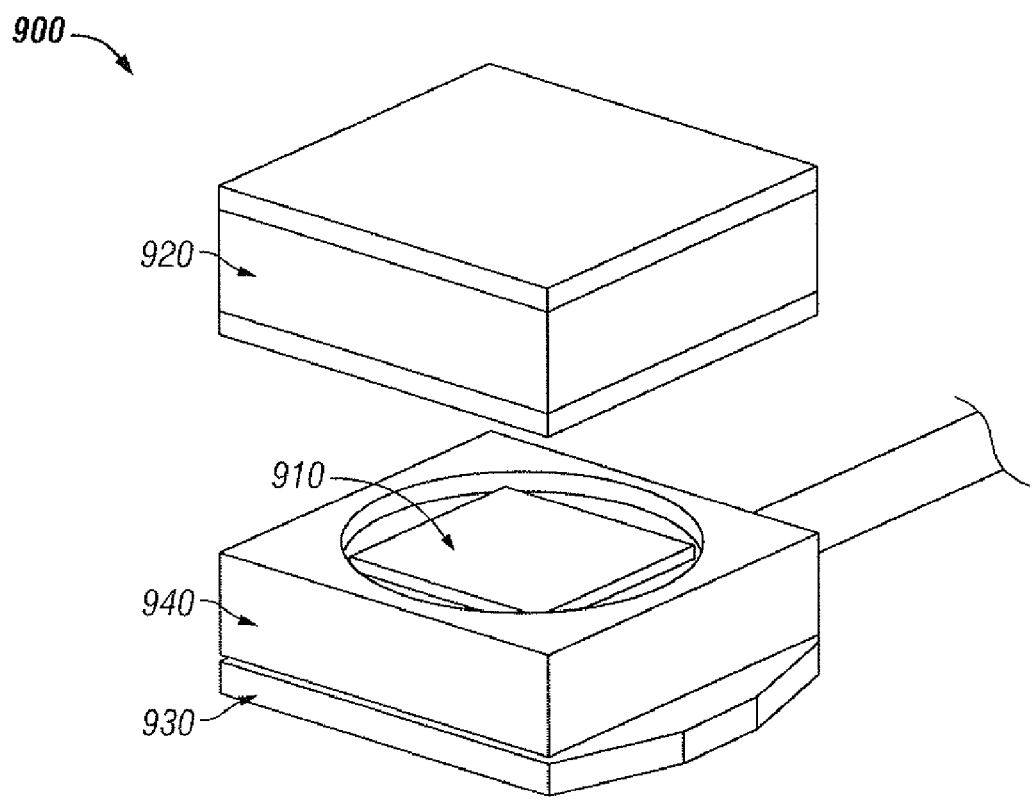
FIG. 11 illustrates a schematic of a wave plate integration and cell alignment in accordance with one embodiment of the present invention.

FIG. 11 illustrates a schematic of a wave plate 1010 integration and cell alignment in accordance with one embodiment of the present invention. A cutout is machined in the spacer 1040 allowing for alignment and integration of the quarter-wave plate 1010. In addition, this figure also illustrates how the NMR cell 1020 can be actively aligned with respect to the components on the base plate 1030. First, assume that the spacer 1040 has been affixed to the base plate 1030 (using epoxy, for example) and that the quarter-wave plate 1010 has been aligned with respect to the VCSEL in such a way that circularly polarized light is achieved. If suitable electrical signals are provided to the bonding pads on the tail end of the flex, the VCSEL and photodiodes can be operated. By temporarily affixing the top of the NMR cell to a stationary stage and at the same time affixing the bottom of the base-plate 1030 to a six-degree-of-freedom alignment stage, the cell can be aligned in such a way that the small opening on top of the cell is centered over the VCSEL and the magnitude of the signal received by all four photodiodes is equal. The cell can be affixed to the spacer 1040 at this position (using for example epoxy) and the assembled NMRG parts can then be removed from their temporary attachment to the alignment stage.

Referring to FIG. 12, a system architecture 1100 is illustrated wherein a magnetometer 1010 is connected to a computer 1120. The computer 1120 is adapted to function as external signal conditioning and detection circuitry facilities. Also shown is FIG. 12, a Gyroscope 1030 can be coupled to a computer 1120, when the sensor is provided in the form of a gyroscope 1130 as opposed to the magnetometer 1110.

Of course, it can be appreciated that a variety of other types of magnetometers and gyroscopes may be implemented in accordance with alternative embodiments.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

The embodiments of the invention in which an exclusive property or right is claimed are defined as follows.

Having thus described the invention what is claimed is:

1. An apparatus for sensing magnetic fields, wherein the apparatus comprises:
    a cell adapted for containing alkali atoms at their vapor pressure so that said alkali atoms can become polarized wherein said cell comprises at least one of a plurality of angled walls to allow counter-propagating probe beams;
    a light source generating a light field containing more than one propagation vector, wherein said light source is arranged to pass said light field through said cell;
    a light source adapted to circularly polarize light;
    at least one photo detector adapted to measure a magnetic field strength based on a reaction of said light field with said alkali atoms after said light field is passed through said cell.

2. An apparatus according to claim 1, at least one coil arranged near said cell adapted to do at least one of create a precise static magnetic field and compensate for residual magnetic fields.

3. An apparatus according to claim 2, wherein said at least one coil comprises at least one of a three-axis coil and a radio-frequency ("RF") coil.

4. An apparatus according to claim 2, wherein said coils are highly conductive traces on a substrate.

5. An apparatus according to claim 1, further comprising a spacer and a magnetic shield, said spacer comprising a non-magnetic material.

6. An apparatus according to claim 1, including a flex circuit adapted to provide signals from the at least one photodetector to a computer adapted as external signal conditioning and detection circuitry facilities.

7. An apparatus according to claim 6, wherein said flex circuit comprises a photo definable polyimide.

8. An apparatus according to claim 6, wherein said alkali vapor cell comprises:
    a plurality of alkali atoms;
    a buffer which prevents collisions of said alkali atoms with walls of said cell.

9. An apparatus according to claim 8, wherein said buffer gas comprises N2 or Ne.

10. An apparatus according to claim 1, wherein said cell is etched in a silicon material and bonded between two layers for interconnects.

11. An apparatus according to claim 1, wherein at least one of a plurality of highly reflective mirrors is deposited on said cell walls to increase the strength of a signal received from said photodiodes.

12. An apparatus according to claim 1, wherein said light source is at least one of a laser, semiconductor laser and a vertical-cavity surface-emitting laser ("VCSEL").

13. An apparatus according to claim 1, wherein said light source further comprises a waveplate adapted to circularly polarize said light, and wherein said light source includes an additional optical feature to attenuate the light and change its spatial mode.

14. An apparatus to claim 1, wherein said photodetector comprises photodiodes positioned on a base plate.

15. An apparatus according to claim 1, wherein said apparatus operates as a micro-electro-mechanical system ("MEMS") device.

16. An apparatus according to claim 1, further comprising a heater, wherein said heater is used to heat said cell and a thermal sensor is used to stabilize the temperature at a predetermined value.

17. An apparatus according to claim 16, wherein at least one of said heater and said thermal sensor is implemented as traces on said base plate.

18. An apparatus according to claim 1, wherein a spacer is used to align and attach said cell to said base plate.

19. A magnetic field sensing device, comprising:
    a magnetic shield to suppress external magnetic fields;
    a cell adapted for containing alkali atoms at a vapor pressure so that said alkali atoms can become polarized;
    a light source generating light field comprised of more than one propagation vector, wherein said light source is arranged to pass said light field through said cell;
    a light source adapted to circularly polarize light;
    at least one photodetector adapted to measure a magnetic field strength based on a reaction of said light with said alkali atoms after said light field is passed through said cell, wherein said at least one photodetector comprises photodiodes positioned on a base plate; and
    wherein said apparatus is adapted in a gyroscope implementation that comprises an additional "noble" gas.

20. An apparatus according to claim 19, wherein:
    at least one coil is arranged near said cell and is adapted to create a static magnetic fields;
    at least one coil is adapted to drive a precession of the noble gas atoms about the static magnetic field; and
    at least one is coil adapted to drive a precession of the alkali atoms about the quasi-static magnetic field created by the static field and the field due to the noble gas atoms.

21. An apparatus according to claim 19, wherein:
    at least one coil adapted to create a static magnetic field that largely cancels the field of the noble gas seen by the alkali atoms;
    the static polarization change of the alkali atoms due to the interaction of the alkali atoms with the noble is under conditions or rotation is monitored; and
    wherein said apparatus is adapted in a comagnetometer implementation.

22. An apparatus according to claim 19, wherein said cell comprise at least one of a nuclear magnetic resonance ("NMR") cell and an alkali vapor cell.

23. An apparatus according to claim 19, wherein:
    said cell comprises at least one of a plurality of angled walls to allow counter-propagation probe beams;
    said cell comprises at least one of a nuclear magnetic resonance ("NMR") cell and an alkali vapor cell;

said cell is etched in a silicon material and bonded between two layers of a Pyrex for interconnects; and at least one of a plurality of highly reflective mirrors is deposited on said cell walls to increase the strength of a signal received from said photodiodes.

24. An apparatus according to claim 19, wherein said light source is at least one of a laser, semiconductor laser and a vertical-cavity surface-emitting laser ("VCSEL").

25. An apparatus according to claim 19, wherein said wave plate further comprises optics adapted to circularly polarize light from said light source, attenuate the light and change its spatial mode.

26. An apparatus according to claim 19, wherein said apparatus is adapted in a gyroscope implementation that comprises an additional gas, wherein said gas is 129Xe.

27. A method of detecting magnetic fields comprising the steps of:

emitting light from a light source;

passing said light through at least one wave plate including optics adapted to circularly polarize light from said light source, attenuate the light and change its spatial mode;

passing said light through a cell containing an alkali species and at least one noble gas or equivalent;

generating an oscillating magnetic filed at a Larmor frequency of noble gas atoms in a direction perpendicular to said magnetic field with at least one of a plurality of coils;

generating an oscillating magnetic field at said Larmor frequency of the alkali atoms with a second set of said coils;

causing an atomic polarization to precess at a drive frequency about a magnetic field;

detecting a transverse component of said atomic polarization by monitoring an absorption of the edges of a diverging light beam using a plurality of photodetectors; and determining the magnitude of the precessing transverse atomic polarization by subtracting signals coming from opposite sides of said light beam.

28. The method of claim 27 wherein said light source is at least one of a laser, semiconductor laser and a vertical-cavity surface-emitting laser ("VCSEL").

29. The method according to claim 28, wherein said buffer gas comprises N2 or Ne.

30. The method of claim 27, wherein said cell comprises at least one of a nuclear magnetic resonance ("NMR") cell and alkali vapor cell.

31. The method of claim 30, wherein said alkali vapor cell comprises:

alkali atoms;

a buffer gas which prevents collisions of said alkali atoms with walls of said cell.

32. The method of claim 27, wherein said cell comprises at least one of a plurality of angled walls to allow counter-propagation probe beams.

33. The method of claim 27, wherein said cell is etched in a silicon material and bonded between two layers of a Pyrex for interconnects.

34. The method of claim 27, wherein at least one of a plurality of highly reflective mirrors is deposited on said cell walls to increase the strength of a signal received from said photodiodes.

35. The method of claim 27, wherein said coils comprises at least one of a three-axis coil and a radio-frequency ("RF") coil.

36. The method of claim 27, wherein said coils are highly conductive traces.

37. The method of claim 27, wherein said photodetector comprises photodiodes.

38. The method of claim 27, wherein a heater is used to heat said cell and a thermal sensor is used to stabilize the temperature at a predetermined value.

39. The method of claim 27, wherein at least one of said heater and said thermal sensor is implemented as traces on said base plate.

40. The method of claim 27, wherein a spacer is used to align and attach said cell to said base plate.

41. An apparatus for sensing magnetic fields, wherein the apparatus comprises:

a cell adapted for containing alkali atoms at a their vapor pressure so that said alkali atoms can become polarized;

a light source adapted to generate a diverging beam of light arranged so that said diverging beam of light is passed through said cell wherein said light source is adapted to produce circularly polarize light; and at least one photodetector adapted to measure magnetic field strength based on a reaction of part of said beam of light with said alkali atoms after said light field is passed through said cell.

* * * * *